United States Patent [19]

Izumi et al.

[11] Patent Number: 5,536,933
[45] Date of Patent: Jul. 16, 1996

[54] LIGHT INFORMATION DEVICE AND METHOD FOR PRODUCING THE SAME

[75] Inventors: Yoshihiro Izumi, Kashihara; Sayuri Fujiwara; Akitsugu Hatano, both of Nara; Yoshitaka Yamamoto, Yamatokoriyama, all of Japan

[73] Assignee: Sharp Kabushiki Kaisha, Osaka, Japan

[21] Appl. No.: 359,279

[22] Filed: Dec. 19, 1994

[30] Foreign Application Priority Data

Dec. 20, 1993 [JP] Japan .................................. 5-320333

[51] Int. Cl.⁶ .................................................. H01J 40/14
[52] U.S. Cl. ........................................ 250/208.2; 359/72
[58] Field of Search ............................ 250/208.2; 359/72

[56] References Cited

U.S. PATENT DOCUMENTS

| | | | |
|---|---|---|---|
| 5,064,275 | 11/1991 | Tsunoda et al. | 359/72 |
| 5,168,378 | 12/1992 | Black et al. | 359/63 |
| 5,177,628 | 1/1993 | Moddel | 359/72 |
| 5,236,620 | 8/1993 | Reiffenrath et al. | 359/104 |
| 5,307,186 | 4/1994 | Izumi et al. | |

FOREIGN PATENT DOCUMENTS

| | | | |
|---|---|---|---|
| 63-64030 | 3/1988 | Japan | 359/72 |
| 64-13527 | 1/1989 | Japan | 359/72 |
| 1-173016 | 7/1989 | Japan | . |
| 2085825 | 3/1990 | Japan | 359/72 |
| 3002836 | 1/1991 | Japan | 359/72 |
| 4-356024 | 12/1992 | Japan | . |
| 0584543A2 | 9/1994 | Japan | 359/72 |

OTHER PUBLICATIONS

U.S. application Ser. No. 08/126,246 filed Sep. 23, 1993 Y. Izumi et al. Pending.
U.S. application Ser. No. 08/006,921 filed Jan. 22, 1993 Y. Ishii et al. Pending.
U.S. application Ser. No. 08/380,249 filed Jan. 27, 1995 Y. Yamamoto et al. Pending.

*Solar Cell Handbook,* (Institute of Electrical Engineers of Japan, Chapter 4, 72–120, Jul., 1985, "Characteristics of Amorphous Si Solar Cell."
M Yamaguchi et al., *Nihon Kagaku Joho,* Chapter 2, pp. 28–42, Jul. 1986, "Development and Practice of Light-Sensitive Element."
Optical Computing, Chapter 2, pp. 10–48, 1989, "Fundamental Knowledge of Optics."
M. Iwasaki et al., *Pioneer Technical Element Report,* No. 6, pp. 2–9, 1992, "Development of Photoconductive Liquid Crystal Light Valve using a Si:H."
D. L. Staebler et al., *Appl. Phys. Lett.,* vol. 31, No. 4, pp. 292–294, Aug., 1977, "Reversible conductivity changes in discharge-produced amorphous $Si^{a)}$."
K. Tanaka et al., *Amorphous Silicon,* Chapter 5, pp. 189–216, Mar. 10, 1993, "Structural stability and optical induction effect."
N. Nakamura et al., *J. Non–Cryst. Solids,* 59 & 60, pp. 1139–1142, 1983, "Influence of Excess Carriers on the Staebler and Wronski Effect of a–Si Solar Cells."
Liquid Crystal Device Handbook, Nikkan Kogyo Shinbunsha, Chapter 6, pp. 417–421, Oct., 1990, "Method for Driving and Writing in a Liquid Crytsal Device."
S. Muto et al., *Jpn. J. Appl. Phys.,* vol. 29, No. 9, pp. 1724–1726, Sep., 1990, "Optical Stabilizer and Directional Coupler Switch Using Polymer Thin Film Waveguides with Liquid Crystal Clad."

Primary Examiner—Georgia Y. Epps
Assistant Examiner—Jacqueline M. Steady
Attorney, Agent, or Firm—David G. Conlin; Brian L. Michaelis

[57] ABSTRACT

The light information device of the invention includes a semiconductor having a photoconductive effect or a photovoltaic effect. In the light information device, a photoconductivity and a dark conductivity of the semiconductor are varied by an aging process using an external stimulus, and the photoconductivity and the dark conductivity after the aging process have values which are equal to or lower than 20% of respective initial values thereof before the aging process.

37 Claims, 5 Drawing Sheets

LIGHT INFORMATION DEVICE AND METHOD FOR PRODUCING THE SAME

BACKGROUND OF THE INVENTION

1. Field of the Invention

The present invention relates to a light information device which uses a semiconductor, and a method for producing such an apparatus. More particularly, the present invention relates to a light information device utilizing a photoconductive effect and a photovoltaic effect.

2. Description of the Related Art

In recent years, amorphous materials of IV-group semiconductors such as silicon (Si), germanium (Ge), and carbon (C) are intensively studied, because such materials exhibit a superior photovoltaic effect and a superior photoconductive effect. It has been found that, when such an amorphous semiconductor is doped with an appropriate dose of hydrogen or fluorine, localized states having an energy level in a forbidden band are extremely reduced, and it is possible to obtain a large $\mu\tau$ product (a product of the mobility of carrier $\mu$ and a lifetime $\tau$; a larger product results in a greater photoconductive effect). Furthermore, the valence electron can be controlled. Accordingly, the amorphous semiconductor with an appropriate dose of hydrogen or fluorine is used for various photoelectric conversion elements.

For example, in amorphous silicon hydride produced by plasma chemical vapor deposition (CVD) (hereinafter referred to as "a-Si:H"), the density of localized states is $10^{16}$ $eV^{-1}cm^{-1}$ or less, and the $\mu\tau$ product is about $10^{-7}$ $cm^2V^{-1}$. The a-Si:H has an optical bandgap Eg within the range of 1.6 to 1.8 eV, so as to have a photosensitivity in a visible light region. Accordingly, a-Si:H is widely used for the photoelectric conversion element.

Electron-hole pairs caused by photoabsorption are separated at the junction of semiconductor and moved in opposite directions, so as to generate an electromotive force. This is the photovoltaic effect. A typical element which utilizes this effect is a solar cell. Unlike crystalline silicon, the above-mentioned a-Si:H has the following advantages:

(1) It can be formed in a thin film having a thickness of 0.5 to 1 $\mu$m (because of its large absorption coefficient).

(2) An extremely small amount of electric power is required for producing a solar cell.

(3) The a-Si:H can be formed on any type of substrate, so that continuous production can be performed.

For these reasons, the a-Si:H is often used for commercially available solar cells. In detail, see "Solar Cell Handbook", (Institute of Electrical Engineers of Japan), Chapter 4.

The electric resistance of a semiconductor is reduced when the semiconductor is irradiated with light while an electric field is applied to the semiconductor. This is the photoconductive effect. Due to this effect, the electrons and holes caused by the photoabsorption can be taken out to the outside through an electrode. Elements utilizing the photoconductive effect include: a light sensor used in an electrophotography, an image sensor, or the like; a spatial light modulator (SLM); an optically addressable display; and the like. For such applications, a-Si:H is increasingly being used, because, in addition to the above-described advantages, a-Si:H has another advantage in that the velocity of response to light is higher compared with other photoconductive materials such as cadmium sulfide (CdS).

A light sensor is described in "Development and Practice of Light-Sensitive Element", NIHON KAGAKU JOHO, Chapter 2, an SLM is described in "Optical Computing", MORIKITA Publisher, Chapter 2, or "Development of Photoconductive Liquid Crystal Light Valve Element using a-Si:H", Pioneer Technical Report, No. 6, pp. 2–9 (1992), and an optically addressable display is described in Japanese Laid-Open Patent Publication Nos. 1-173016 and 4-356024.

The semiconductor amorphous material such as a-Si:H has a reversible photoinducing phenomenon which is called the SW effect (Staebler-Wronski effect). In this phenomenon, long exposure of a-Si:H to bandgap light decreases both the photoconductivity and the dark conductivity thereof, and the photoconductivity and the dark conductivity are restored by annealing at high temperatures. This phenomenon was discovered by Staebler and Wronski in 1977. The SW effect is now described in detail.

FIG. 6 shows the variations of dark conductivity and the photoconductivity in the reversal photoinducing phenomenon which were first measured by Staebler and Wronski. These measured values indicate the case where white light of 200 mW/cm$^2$ (wavelength of 600 to 900 nm) was used. As is understood from FIG. 6, exposure to light changes the dark conductivity from state A to state B, and the dark conductivity is lower by several orders of magnitude. By the exposure, the photoconductivity decreases by about one order of magnitude. The state in which the dark conductivity is lower by the exposure to light (state B) is stable at room temperature. However, if the temperature is increased to 160° C. or more, the relaxation process is remarkably observed, and the dark conductivity and the photoconductivity are completely restored to the original values within several hours (state A).

In the currently considered dominant opinion, the SW effect is caused because, when the photoinducing electron-hole pairs are non-radiatively recombined via the conduction band tail state and the valence band tail state, defects are generated in the film. For greater detail, see "Reversible conductivity change in discharge-produced amorphous Si", Appl. Phys. Lett. 31, 292 (1977), or "Amorphous Silicon", Ohmsha, Chapter 5, and the like.

It was also reported that the same effect could be attained by continuously applying an electric field to the amorphous material and then injecting carriers into the said amorphous material. For greater detail, see "Influence of excess carriers on the Staebler and Wronski effect of a-Si solar cells", J. Non-cryst. Solids 59&60, 1139 (1983). The reason why the same effect can be obtained is now dominantly considered to be that when the carriers injected in the i-layer of the solar cell are recombined, defects are induced, that cause the film quality of the i-layer to deteriorate. However, the physical mechanism has not yet been sufficiently clarified, and the mechanism is now being intensively studied.

It is known that the amorphous material has (a) a characteristic in that the metastable state is changed by external stimuli such as continuous light irradiation or the application of an electric field, and hence the dark conductivity and photoconductivity are varied with time, and (b) a characteristic in that the dark conductivity and photoconductivity are restored to the original values by annealing at high temperatures.

However, such changes of dark conductivity and photoconductivity with time are not preferable for various light information devices using semiconductor amorphous materials. This is because the characteristics of the apparatus deviate from the initial values as time elapses, so that a satisfactory performance cannot be obtained. Thus, there arises a problem which affects the reliability of the apparatus.

The influence of the SW effect will now be described in detail using an optically addressable display apparatus utilizing the photoconductive effect of a-Si:H as an example.

In an active matrix type display apparatus, active elements (such as transistors and diodes) which are provided for respective pixels are individually driven, so that a display with superior quality can be realized. A TFT-LCD using a thin film transistor as the active element and using liquid crystal as a display medium is typical of such an active matrix type display apparatus. In such a TFT-LCD, when a driving signal is transmitted through electric wiring, the signal waveform is delayed due to the wiring resistance and the parasitic capacitance. Thus, there exists a problem in that a large-screen type display apparatus and a high-definition display apparatus cannot be realized. In addition, in a display apparatus in which electric wiring used for scanning signals and for data signals are both arranged in an X-Y matrix on one and the same substrate, there exits a problem in terms of the process in that electric short-circuit and line breakage may easily occur at the crossings of the electric wirings. In order to solve these problems, an optically addressable display apparatus in which driving signals are optically transmitted has been developed.

FIG. 7 shows an equivalent circuit of a pixel portion of an optically addressable display apparatus described in, for example, Japanese Laid-Open Patent Publication No. 4-356024. In this figure, $R_{ON}$ and $R_{OFF}$ indicate an on resistance and an off resistance of a light switching element 30 formed of a-Si:H, and $C_{LC}$ indicates the capacity of a display medium (e.g., liquid crystal).

In the selected time period $T_1$, the condition for safely writing 99% or more of the contents of the data signal via the light switching element 30 is represented as follows:

$$4.6 \times \tau_{ON} = 4.6 \times R_{ON} \times C_{LC} < T_1 \quad (1)$$

where $\tau_{ON} = R_{ON} \times C_{LC}$.

In a non-selected time period $T_2$, if the data signal is leaked from the data line through the light switching element 30, crosstalk occurs. The condition for suppressing the leakage of the data signal within 5% is represented as follows:

$$\tau_{OFF}/19.5 = R_{OFF} \times C_{LC}/19.5 > T_2 \quad (2)$$

where $\tau_{OFF} = R_{OFF} \times C_{LC}$.

In the case of a video display using the NTSC system, in general, $T_1 = 63.5$ μsec., $T_2 = 16.7$ msec. (1/60 sec.). It is assumed that $C_{LC}$ is set to be 1 pF, as a representative example, the following is obtained from Expressions (1) and (2) above.

$$R_{ON} < 1.4 \times 10^6 \, \Omega, \, R_{OFF} > 3.3 \times 10^{11} \, \Omega$$

Thus, the ON/OFF ratio is required to be five orders or more. Expressions (1) and (2) are described in detail in "Liquid Crystal Device Handbook", Nikkan Kogyo Shinbunsha, p. 418.

As described above, the light switching element used in the optically addressable display apparatus is required to set the ON/OFF ratio, i.e, the ratio of the photoconductivity $\sigma_p$ to the dark conductivity $\sigma_d$ to be five orders or more.

The relationship between the light irradiation intensity I and the photoconductivity $\sigma_p$ of a-Si: H is, for example, represented as follows.

$$\sigma_p \propto I^\gamma \exp(-W/k_B T) \quad (3)$$

where W denotes an activation energy, $k_B$ denotes a Boltzmann coefficient, and T denotes an absolute temperature. It is known that the photoconductivity $\sigma_p$ is in proportion to the γth power of the light irradiation intensity I. Herein, γ can be a value in the range of 0.5 to 1.

From such a relationship, in order to set the ratio of the photoconductivity $\sigma_p$ to the dark conductivity $\sigma_p$ of a-Si:H to be five orders or more, it is necessary to radiate light with very high intensity. Experimentally, when bandgap light of several tens of mW/cm² or more is radiated, the conductivity ratio of five orders or more can be obtained.

Accordingly, the light switching element used in the above-described display apparatus is directly irradiated with light (signal) of several tens of mW/cm² or more. As a result, the photoinducing phenomenon of a-Si:H appears as a time elapses, and the characteristics of the light switching element are changed from the initial characteristics. Then, finally the photoconductivity $\sigma_p$ and the dark conductivity $\sigma_p$ do not satisfy the conditions of Expressions (1) and (2). Thus, the deterioration of display performance such as the reduction of contrast and screen flicker becomes very obvious. This is the critical problem in terms of the reliability of the display apparatus.

In the above description, the light switching element used in the optically addressable display apparatus is described. Similarly, in various light information apparatus such as a light sensor utilizing the photoconductive effect of a semiconductor amorphous material, and an SLM, the aging of device characteristics due to the SW effect greatly affects the reliability of the apparatus.

In addition, in the case where a conventional light emitting device is used, it is difficult to increase the intensity of light to be radiated. Therefore, it is difficult to make a margin for the design values of photoconductivity $\sigma_p$ and the dark conductivity $\sigma_p$ so as to satisfy the conditions of Expressions (1) and (2) even as the result of such aging.

In the case of an amorphous solar cell, the stability is currently being improved by modifying the device structure as well as the stability of the film of the semiconductor amorphous material. However, the degradation of conversion efficiency of about 10% cannot be avoided.

In addition, in order to realize a higher definition display apparatus such as high-definition television (HDTV), it is necessary to further improve the ON/OFF ratio of the light switching element by at least one order.

SUMMARY OF THE INVENTION

The light information device of this invention includes a semiconductor having a photoconductive effect or a photovoltaic effect, wherein a photoconductivity and a dark conductivity of the semiconductor are varied by an aging process using an external stimulus, and the photoconductivity and the dark conductivity after the aging process have values which are equal to or lower than 20% of respective initial values thereof before the aging process.

In one embodiment of the invention, the semiconductor is an amorphous semiconductor including a Group-IV semiconductor as a main component.

In another embodiment of the invention, a ratio of the photoconductivity to the dark conductivity of the semiconductor after the aging process is twice or more as high as an initial ratio of the photoconductivity to the dark conductivity before the aging process.

According to another aspect of the invention, a method for producing a light information device including a semiconductor having a photoconductive effect or a photovoltaic effect is provided. The method includes an aging step of varying a photoconductivity and a dark conductivity of the semiconductor by applying an external stimulus to the semiconductor, so as to reduce the photoconductivity and a dark conductivity to be 20% or less of respective initial values thereof before applying the external stimulus.

In one embodiment of the invention, the aging step includes the steps of: irradiating the semiconductor with light; and varying the photoconductivity and the dark conductivity of the semiconductor by continuously performing the light irradiation for a predetermined time period, and reducing the photoconductivity and the dark conductivity to be 20% or less of the respective initial values thereof before the light irradiation. The aging step may further include the step of: applying an electric field to the semiconductor for a predetermined time period.

In another embodiment of the invention, in the step of light irradiation, the semiconductor is irradiated with light of an intensity of 100 mW/cm$^2$ or more. In the step of light irradiation, the semiconductor may be irradiated with light in a wavelength band including a wavelength corresponding to a bandgap of the semiconductor.

In another embodiment of the invention, the aging step includes the steps of: applying an electric field to the semiconductor; and varying the photoconductivity and the dark conductivity of the semiconductor by continuously applying the electric field for a predetermined time period, and reducing the photoconductivity and the dark conductivity to be 20% or less of the respective initial values thereof before the application of the electric field. The aging step may further include the step of: irradiating the semiconductor with light for a predetermined time period.

In another embodiment of the invention, in the step of applying the electric field, electric charge of 50–200 mA/cm$^2$ is injected into the semiconductor.

According to another aspect of the invention, a light information apparatus including optical addressing means for selectively turning ON at least one of a plurality of switching devices in accordance with a light signal is provided. In the apparatus, each of the plurality of switching devices includes an input terminal for receiving an electric signal, an output terminal for outputting the received electric signal, and a semiconductor for providing a conductive path from the input terminal to the output terminal in accordance with the received light signal due to a photoconductive effect, and a photoconductivity and a dark conductivity of the semiconductor of each of the switching devices are varied by an aging process using an external stimulus, and the photoconductivity and the dark conductivity after the aging process are reduced to be 20% or less of respective initial values thereof before the aging process.

In one embodiment of the invention, the optical addressing means includes means for supplying the electric signal to each of the plurality of switching devices, and means for supplying the light signal to each of the plurality of switching devices.

In another embodiment of the invention, the means for supplying the light signal includes light emitting means for generating the light signal, and means for selectively transmitting the light signal from the light emitting means to the plurality of switching device.

In another embodiment of the invention, the light information apparatus further includes: pixel electrodes each provided for a corresponding one of the plurality of switching devices, and each connected to the output terminal of the corresponding one of the switching devices, each of the pixel electrodes receiving the electric signal via the corresponding one of the switching devices; and a display medium driven by the pixel electrodes.

In another embodiment of the invention, the light emitting means is a semiconductor laser.

According to another aspect of the invention, a method for producing a light information apparatus including optical addressing means for selectively turning ON at least one of a plurality of switching devices in accordance with a light signal, each of the plurality of switching devices includes an input terminal for receiving an electric signal, an output terminal for outputting the received electric signal, and a semiconductor for providing a conductive path from the input terminal to the output terminal in accordance with the received light signal due to a photoconductive effect. The method includes an aging step of varying a photoconductivity and a dark conductivity of the semiconductor by applying an external stimulus, and reducing the photoconductivity and the dark conductivity after the aging process to be 20% or less of respective initial values thereof before applying the external stimulus.

In one embodiment of the invention, the optical addressing means includes light emitting means for generating the light signal, and the aging step includes the steps of: irradiating the semiconductor with light emitted from the light emitting means; and varying the photoconductivity and the dark conductivity of the semiconductor by continuously performing the light irradiation for a predetermined time period, and reducing the photoconductivity and the dark conductivity after the light irradiation to be 20% or less of respective initial values thereof before the light irradiation.

In another embodiment of the invention, the optical addressing means includes light guiding means for transmitting the light signal from the light emitting means to each of the plurality of switching devices, and the light irradiation is performed via the light guiding means.

In another embodiment of the invention, the light emitting means is a semiconductor laser, and laser light is used for the light irradiation.

In another embodiment of the invention, in the step of light irradiation, the semiconductor is irradiated with light of an intensity of 100 mW/cm$^2$ or more.

In another embodiment of the invention, in the step of light irradiation, the semiconductor is irradiated with light in a wavelength band including a wavelength corresponding to a bandgap of the semiconductor.

In another embodiment of the invention, the optical addressing means includes means for supplying the electric signal to each of the plurality of switching devices, and the aging step further includes a step of applying an electric field to the semiconductor for a predetermined time period by applying the electric signal to the respective switching devices by the supplying means.

In another embodiment of the invention, the optical addressing means includes means for supplying the electric signal to each of the plurality of switching devices, and the aging step includes the steps of: applying an electric field to the semiconductor by supplying the electric signal to the respective switching devices by the supplying means; and varying the photoconductivity and the dark conductivity of the semiconductor by applying the electric field for a predetermined time period, and reducing the photoconductivity and the dark conductivity to be 20% or less of the respective initial values thereof before the application of the electric field.

In another embodiment of the invention, in the step of applying the electric field, electric charge of 50–200 mA/cm$^2$ is injected into the semiconductor.

In another embodiment of the invention, the light address means includes light emitting means for generating the light signal, and the aging step includes a step of irradiating the semiconductor with light emitted from the light emitting means for a predetermined time period.

According to another aspect of the invention, the light information device includes: a first substrate and a second substrate; a semiconductor layer disposed on one face of the first substrate facing the second substrate; and an electro-optic medium provided on one face of the second substrate facing the first substrate, the light information device writing spatial light information input from the outside to the semiconductor layer through the first substrate into the electro-optic medium using a photoconductive effect of the semiconductor layer, and the light information device reading the spatial light information written in the electro-optic medium by modulating light input through the second substrate by the electro-optic medium, wherein the semiconductor layer has a photoconductivity and a dark conductivity varied by an aging process using an external stimulus, and values of the varied photoconductivity and the dark conductivity are 20% or less of respective initial values thereof before the aging process.

According to another aspect of the invention, a method for producing a light information device including: a first substrate and a second substrate; a semiconductor layer disposed on one face of the first substrate facing the second substrate; and an electro-optic medium provided on one face of the second substrate facing the first substrate, the light information device writing spatial light information input from the outside to the semiconductor layer through the first substrate into the electro-optic medium using a photoconductive effect of the semiconductor layer, and the light information device reading the spatial light information written in the electro-optic medium by modulating light input through the second substrate by the electro-optic medium is provided. The method includes an aging step of varying a photoconductivity and a dark conductivity of the semiconductor layer by applying an external stimulus to the semiconductor layer, and reducing the photoconductivity and the dark conductivity to be 20% or less of respective initial values thereof before applying the external stimulus.

In one embodiment of the invention, in the aging step includes the steps of: irradiating the semiconductor layer with light; and varying the photoconductivity and the dark conductivity of the semiconductor layer by continuously performing the light irradiation for a predetermined time period, and reducing the photoconductivity and the dark conductivity to be 20% or less of respective initial values thereof before the light irradiation.

In another embodiment of the invention, in the step of light irradiation, the semiconductor layer is irradiated with light with an intensity of 100 mW/cm$^2$.

In another embodiment of the invention, in the step of light irradiation, the semiconductor layer is irradiated with light in a wavelength band including a wavelength corresponding to a bandgap of the semiconductor layer.

In another embodiment of the invention, the light irradiation is performed by using a lamp selected from a group of a halogen lamp, a metal halide lamp, and a xenon lamp.

In another embodiment of the invention, the aging step further includes the step of applying an electric field to the semiconductor layer for a predetermined time period.

In another embodiment of the invention, the aging step includes the steps of: applying an electric field to the semiconductor layer; and varying the photoconductivity and the dark conductivity of the semiconductor layer by continuously performing the application of the electric field for a predetermined time period, and reducing the photoconductivity and the dark conductivity to be 20% or less of respective initial values thereof before the application of the electric field.

In another embodiment of the invention, in the step of applying the electric field, electric charge of 50–200 mA/cm$^2$ is injected into the semiconductor layer.

In another embodiment of the invention, the aging step further includes the step of irradiating the semiconductor layer with light for a predetermined time period.

Thus, the invention described herein makes possible the advantages of (1) providing a light information apparatus using a photoelectric converting element with a sufficient ON/OFF ratio and little or no aging of device characteristics, and (2) providing a method for producing the light information apparatus.

These and other advantages of the present invention will become apparent to those skilled in the art upon reading and understanding the following detailed description with reference to the accompanying figures.

DESCRIPTION OF THE PREFERRED EMBODIMENTS

Figure 4:
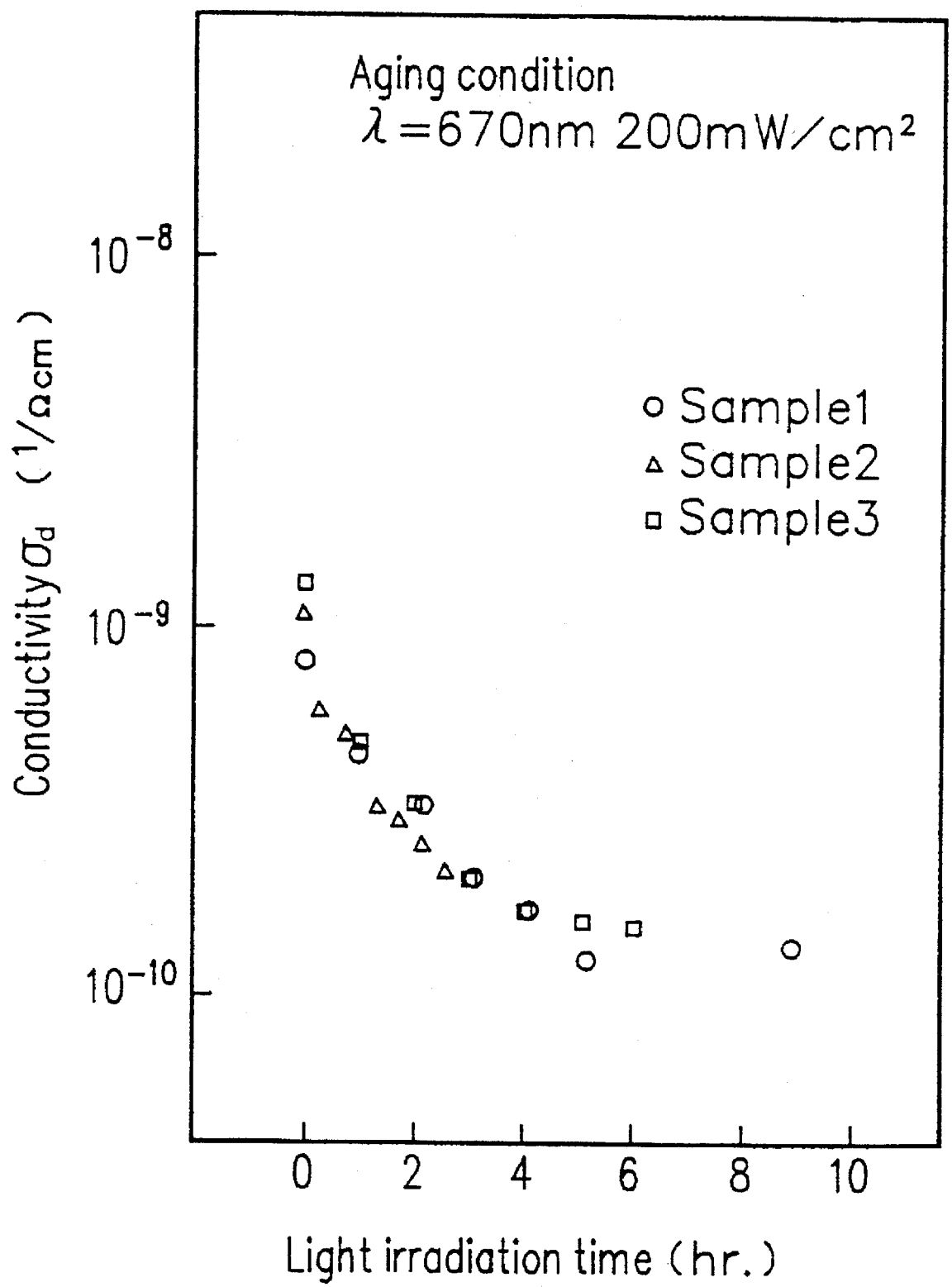
FIG. 4 is a diagram illustrating the change of the dark conductivity $\sigma_p$ of a-Si:H along a time axis due to the SW effect which is experimentally obtained.
Figure 5:
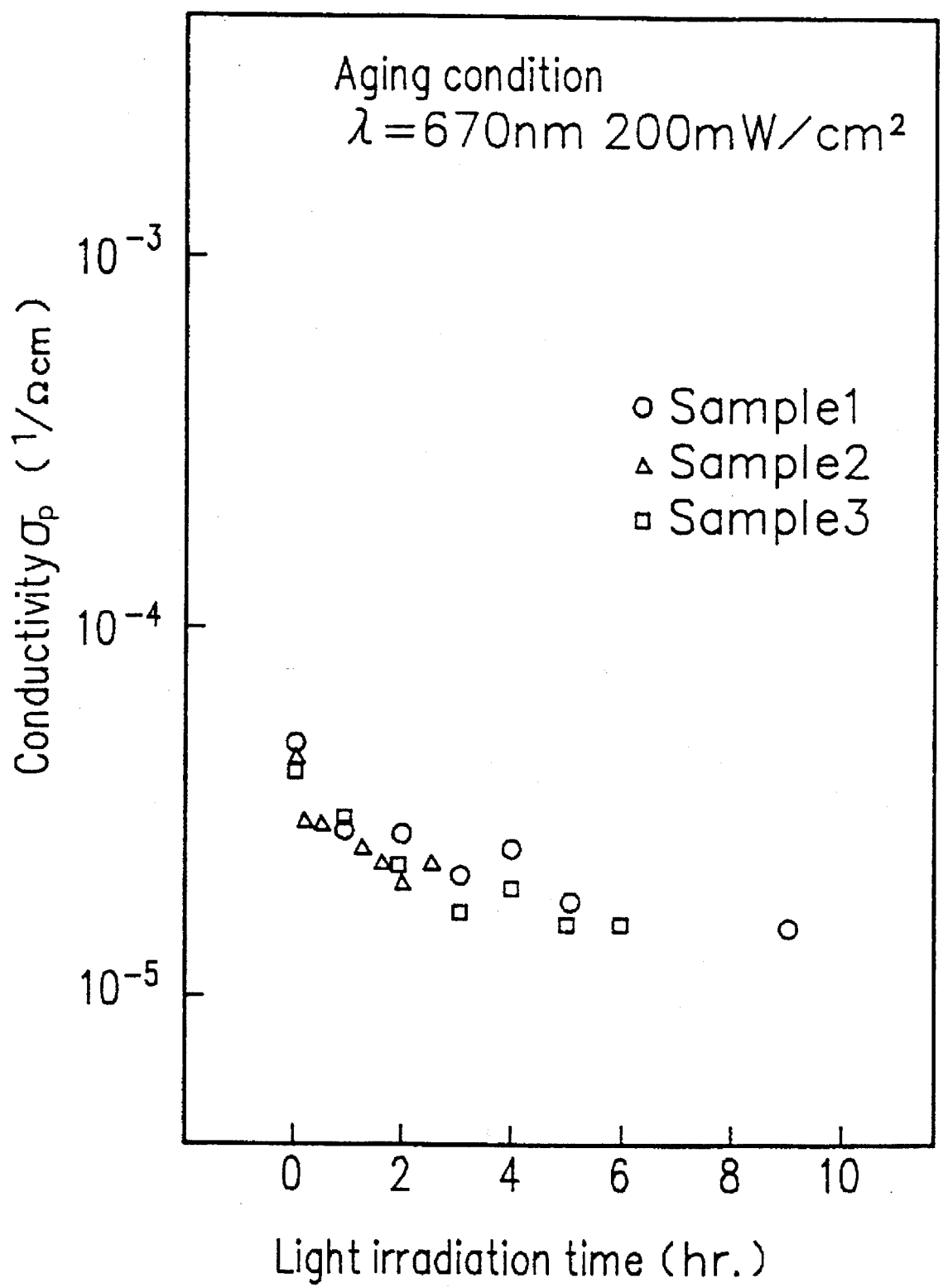
FIG. 5 is a diagram illustrating the change of the photoconductivity $\sigma_p$ of a-Si:H along a time axis due to the SW effect which is experimentally obtained.
Figure 6:
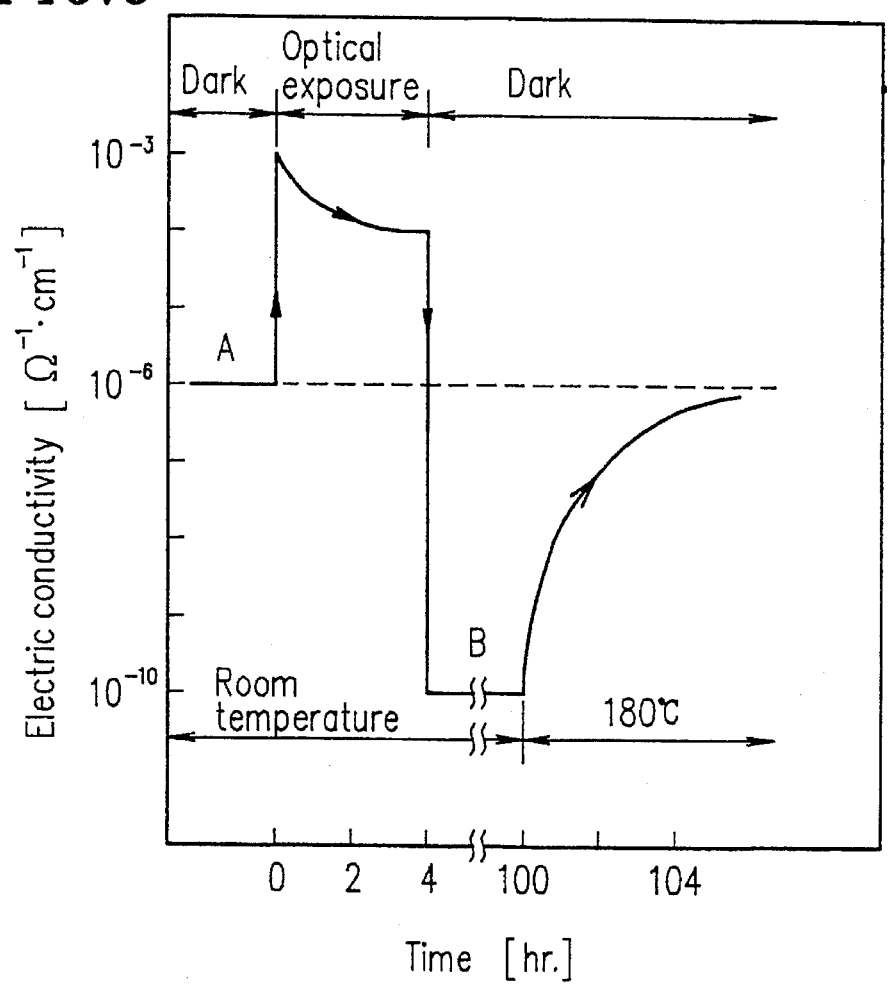
FIG. 6 is a diagram illustrating the usual reversible photoinducing phenomenon (the SW effect) of amorphous silicon.
Figure 7:
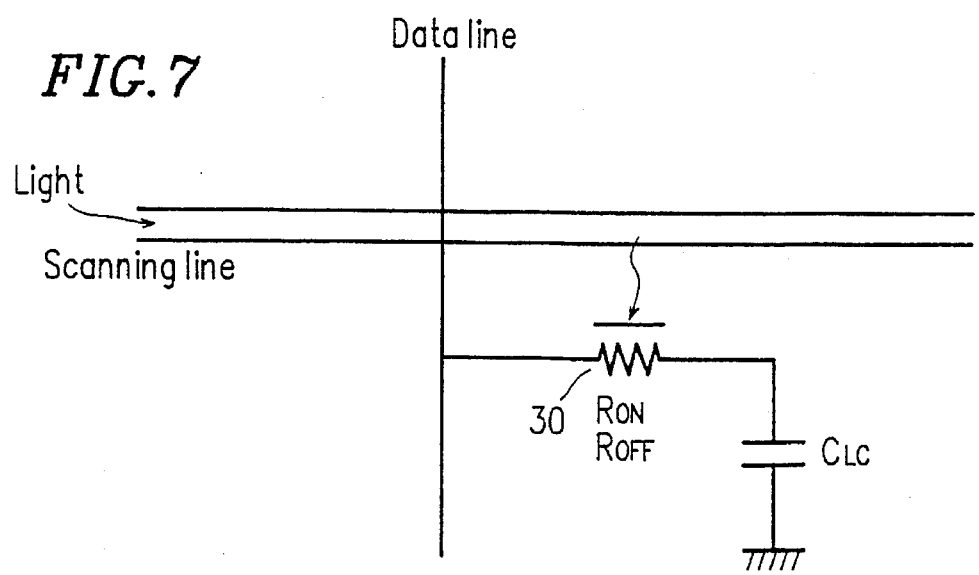
FIG. 7 is a diagram showing an equivalent circuit of a pixel portion of an optically addressable display apparatus.

First, FIGS. 4 and 5 show the characteristics of a photoelectric converting element used in a light information device of the invention. As a semiconductor material, a-Si:H is used in this description. FIG. 4 shows the change of the dark conductivity $\sigma_d$ of a-Si:H along a time axis due to the SW effect which is experimentally obtained. FIG. 5 shows the change of the photoconductivity $\sigma_p$ of a-Si:H along the time axis due to the SW effect which is experimentally obtained. Both the photoconductivity $\sigma_p$ and the dark conductivity $\sigma_d$ are largely varied with time in the initial stage, and as the light irradiation time period is increased, the change gradually becomes smaller. Hereinafter, the phenomenon of the SW effect caused by the light irradiation is referred to as photo-aging.

In more detail, the dark conductivity is varied from about $10^{-9}$ (1/Ωcm) in the initial state to about $10^{-10}$ (1/Ωcm) after the photo-aging. The photoconductivity is varied from about $5\times10^{-5}$ (1/Ωcm) in the initial state to about $10^{-5}$ (1/Ωcm) after the photo-aging. That is, both the photoconductivity $\sigma_p$ and the dark conductivity $\sigma_d$ are changed to be 20% or less of the initial values. Moreover, after the conductivity is once changed to be 20% or less, the change with time of the conductivity is very small.

The same effect can be obtained by applying an electric field to the semiconductor material (hereinafter, such a case is referred to as an electric-field aging).

The value of the dark conductivity $\sigma_d$ is reduced by about one order as compared with the initial value due to the SW effect. However, the ratio of the photoconductivity $\sigma_p$ to the dark conductivity $\sigma_d$ is somewhat increased from the initial value. In other words, the ratio of the photoconductivity to the dark conductivity (the ratio of $\sigma_p/\sigma_d$) are increased to be about double that of the initial state due to the photo-aging.

Therefore, similar to the above-described optically addressable display apparatus, in the apparatus in which the driving is performed by utilizing the ratio of the photoconductivity $\sigma_p$ to the dark conductivity $\sigma_d$ of the photoelectric converting element, the photoelectric converting element is designed in view of the variation with time due to the SW effect. Accordingly, the light irradiation or application of electric field is performed for driving from the time at which the SW effect is sufficiently achieved, so that the variation with time of the device performance thereafter can be relatively small. In addition, the ratio of the photoconductivity $\sigma_p$ to the dark conductivity $\sigma_d$ (the ON/OFF ratio) can be improved by the difference between the varied amount of the photoconductivity $\sigma_p$ and the varied amount of the dark conductivity $\sigma_d$. Thus, the performance as the switching element can also be improved.

By using a semiconductor material which is stabilized by the external stimulus (aging) such as light irradiation or the application of an electric field, i.e., by using the semiconductor material which positively uses the SW effect, the variation over time of the characteristics can be reduced, and a photoelectric converting element with a stable performance can be obtained. In addition, by the aging process, the sensitivity (ON/OFF) of the employed semiconductor with respect to the light signal is enhanced, and the performance of the photoelectric converting element is improved. However, in the case of the amorphous solar cell which uses the photovoltaic effect, the conversion efficiency is degraded by the SW effect, so that it is not desirable to perform the aging.

In the examples described below, a light information apparatus in which a IV-group amorphous semiconductor such as a-Si:H is used is described. It is appreciated that the invention is not limited to such a specific type of apparatus. The present invention can be applied to an apparatus which uses any semiconductor exhibiting the SW effect such as a chalcogenide semiconductor or a microcrystal semiconductor, and the same effects can be attained. In some crystalline semiconductor materials, a phenomenon similar to the SW effect can be observed by applying external stimulus such as an application of an electric field to the junction. The present invention can be applied to such crystalline semiconductor materials, and the same effects can be attained.

Hereinafter, detailed examples will be described with respect to various light information devices according to the invention.

EXAMPLE 1

First, an optically addressable display apparatus will be described.

Figure 1:
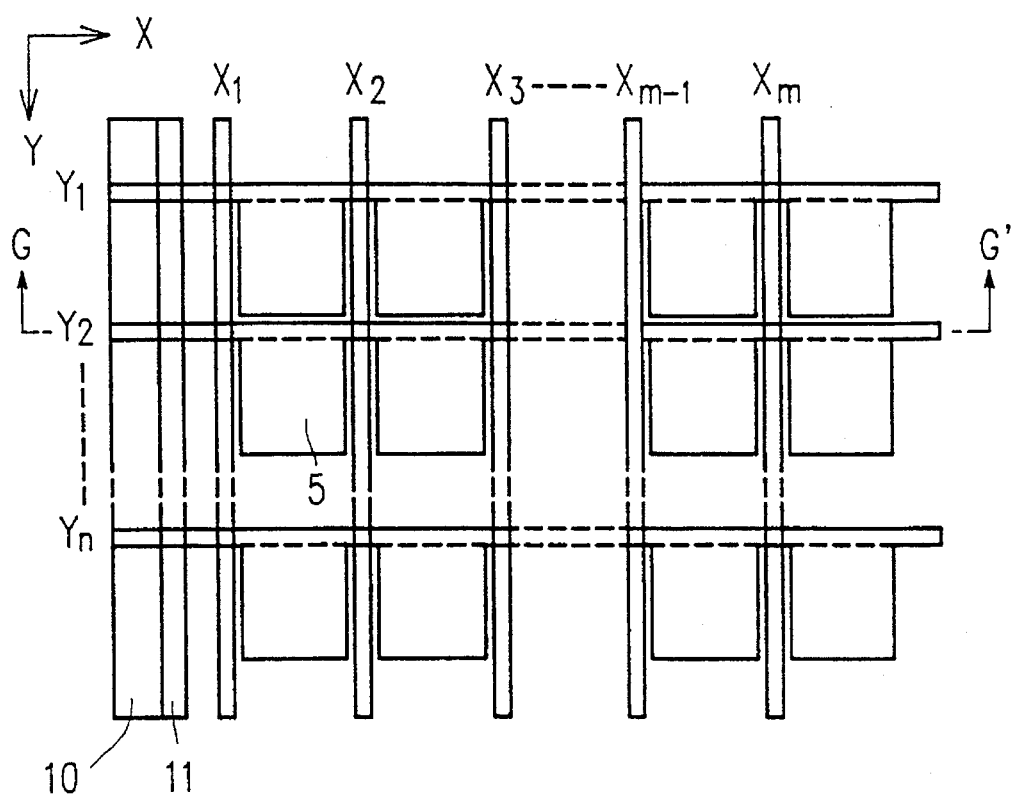
FIG. 1 is a plan view showing the construction of an optically addressable display apparatus in Example 1 according to the invention.
Figure 2:
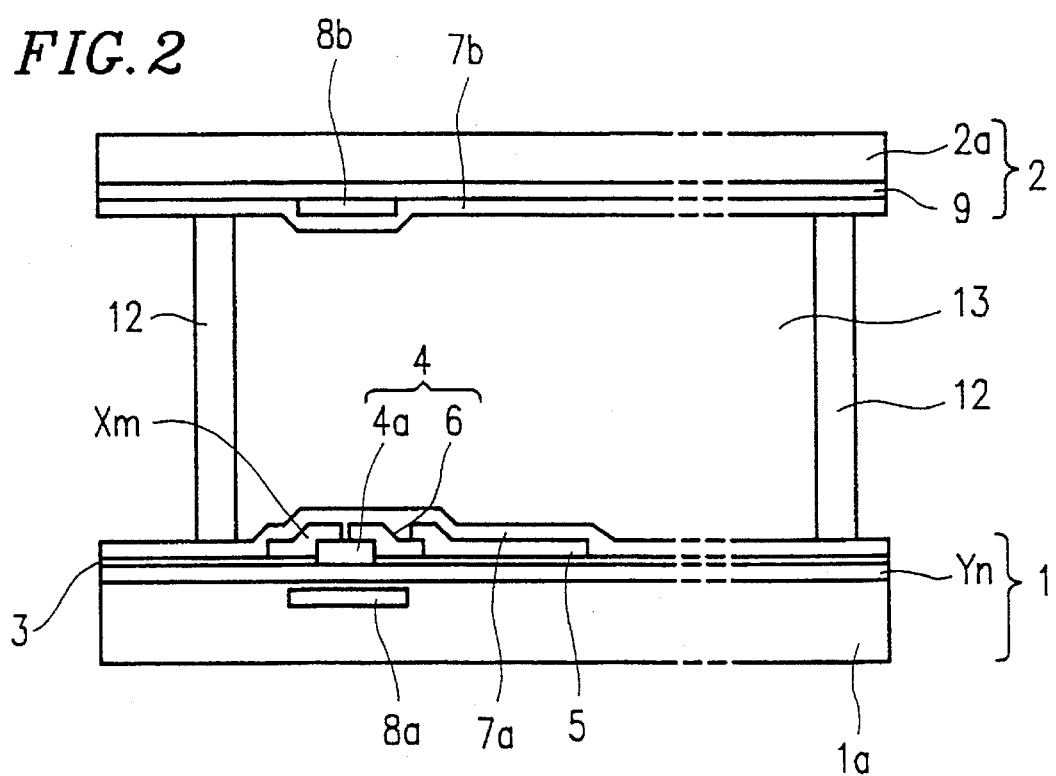
FIG. 2 is a cross-sectional view taken along the line G–G' in FIG. 1.

FIG. 1 is a plan view showing the construction of an optically addressable display apparatus. FIG. 2 is a cross-sectional view taken along a line G–G' in FIG. 1. In the display apparatus, a pair of substrates 1 and 2 are disposed so as to face each other with liquid crystal 13 as a display medium interposed therebetween.

As for the substrate 1 (the lower one in the figure), a plurality of optical waveguides $Y_1, Y_2, \ldots, Y_n$ are arranged along a Y-direction on a glass substrate 1a as a base. A cladding layer 3 is formed over the entire surface thereof. Through the optical waveguides such as $Y_1$, a light signal is transmitted from a light emitting element array 10 which is provided in one end portion of the substrate 1a. On the cladding layer 3, a plurality of signal electrodes $X_1, X_2, \ldots, X_n$ arranged along an X-direction so as to cross the optical waveguides such as $Y_1$. At each of the crossings of the optical waveguides $Y_n$ and the signal electrodes $X_m$, light switching element 4 including a photoconductive material 4a is provided. The light switching element 4 has an input terminal for connecting the photoconductive material 4a to the signal electrode $X_m$ (the input terminal may be a part of the signal electrode $X_m$). The photoconductive material 4a of the light switching element 4 is connected to a pixel electrode 5 via a drain electrode (output terminal) 6 which is a part of the light switching element 4. An aligning film 7a made of polyimide or the like is formed so as to cover the substrate 1a having such a structure. Also in the substrate 1a, a light blocking film 8a is buried so as to prevent unwanted external light from entering the light switching element 4. In FIG. 1, the reference numeral 11 denotes a microlens array for efficiently guiding the light signals from the light emitting element array 10 to the optical waveguides $Y_n$.

In the other substrate 2, a transparent counter electrode 9 is formed on a glass substrate 2a as a base. A light blocking film 8b is formed on the counter electrode 9 in order to prevent unwanted external light from entering the light switching element 4. An aligning film 7b made of polyimide or the like is formed so as to cover the substrate 2a having such a structure.

The liquid crystal 13 interposed between the substrates 1 and 2 is sealed with a sealing member 12.

Accordingly, in the optically addressable display apparatus with the above-described construction, the following operation is performed. The light switching element 4 is controlled by a light signal which is transmitted from the light emitting element array 10 via the optical waveguide $Y_n$. The light switching element 4 becomes low resistive by light irradiation, so as to electrically connect the signal electrode $X_m$ to the pixel electrode 5. When the light switching element 4 is not irradiated with light, the light switching element 4 becomes high resistive, so as to electrically insulate the signal electrode $X_m$ from the pixel electrode 5. In other words, the optically addressable display apparatus in this example utilizes light as a scanning signal, and can be driven by utilizing the change of resistance of the light switching element 4 due to the photoconductive effect.

Next, a method for producing the optically addressable display apparatus will be described.

First, a light blocking film 8a for preventing unwanted external light from entering a light switching element 4 is buried in the substrate 1a. The pattern of the light blocking film 8a is formed so as to overlap the pattern of the light switching element 4. Alternatively, substrate 1a which is prepared so as to include the light blocking film 8a can be used.

Next, optical waveguides $Y_1, Y_2, \ldots, Y_n$ are formed on the substrate 1a. As the optical waveguides $Y_1, Y_2, \ldots, Y_n$, for example, optical fibers which are attached on a glass substrate 1a, ion exchange (or diffusion) type glass wave guides, or wave guides made of a polymer such as polyimide or PCZ can be used. A light emitting element array 10 is previously formed in one end portion of the optical waveguide $Y_1$ and the like. As the light emitting element array 10, an LD array or an LED array can be used. Instead of the light emitting element array 10, an optical scanning system utilizing a polyhedron mirror and an acoustic optical element can be used.

Next, a cladding layer 3 made of a film having a low refractive index such as $SiO_2$ is formed on the optical waveguides $Y_1, Y_2, \ldots, Y_n$. Then, a plurality of signal electrodes $X_1, X_2, \ldots, X_m$ are formed so as to cross the respective optical waveguides $Y_1, Y_2, \ldots, Y_n$ on the cladding layer 3.

Then, a light switching element 4 made of a-Si:H is formed. The a-Si:H film is formed by plasma chemical vapor deposition (CVD) using a silane gas ($SiH_4$) and a hydrogen gas ($H_2$). Instead of the plasma CVD, the a-Si:H film can be formed by sputtering.

A pixel electrode 5 made of a transparent conductive thin film such as ITO (indium tin oxide) is formed on the substrate 1a having such a structure.

The other substrate 2 is fabricated in the following manner. First, a transparent counter electrode 9 made of, for example, ITO is formed on a substrate 2a.

Next, a light blocking layer 8b for preventing light from the above (i.e., external light) from entering the light switching element 4 is provided on the counter electrode 9. The pattern of the light blocking layer 8b is formed so as to overlap the pattern of the light switching element 4.

As the result of the above-described process steps, a pair of substrates 1 and 2 are completed. It is appreciated that the production order to the substrates 1 and 2 can be reversed, that is, the substrate 2 can be produced prior to the production of the substrate 1.

Next, aligning films 7a and 7b made of, for example, polyimide are formed on the substrates 1 and 2, respectively, for example, by spin coating. Thereafter, a rubbing treatment is performed for the aligning films 7a and 7b. For the aligning films 7a and 7b, any other aligning film materials such as an organic film of polyamide, various LB films, or an obliquely deposited film of SiO or $SiO_2$ can be used.

Then, the substrates 1 and 2 are attached to each other with a sealing member 12 interposed therebetween in such a manner that the aligning films 7a and 7b face each other. At this time, it is convenient that spacers (which are not shown in the diagram) are provided between the substrates 1 and 2. The provision of spacers has an advantage in that the gap between the substrates 1 and 2 can be kept constant at any points of the substrate 1 (or 2).

Next, liquid crystal 13 is injected and sealed between the substrates 1 and 2.

In the optically addressable display apparatus produced in the above-described method, the following modes can be adopted as the display modes of liquid crystal. In the case of nematic liquid crystal, a TN (Twisted Nematic) mode, a guest-host mode, an ECB (Electrically Controlled Birefringence) mode, an STN (Super Twisted Nematic) mode, and a phase transition mode can be used. In the case of chiral smectic liquid crystal, an SSFLC (Surface Stabilized Ferroelectric Liquid Crystal) mode can be used. In addition, a PDLC (Polymer Dispersed Liquid Crystal) mode using a composite film of polymer and liquid crystal can be used. In this example, a TN mode using fluorine liquid crystal ZLI4792 produced by MERCK & Co., Inc. is adopted.

In the above-described optically addressable display apparatus, light is used as the scanning signal, and thus the operation is less influenced by the wiring resistance than in the case where an electric signal is used as the scanning signal. Accordingly, there occurs no delay in signal waveform. In the case where the electric signal is used as the scanning signal, a parasitic capacitance is generated in a peripheral portion or overlapped portion of the wiring. It is easily recognized that, in the case where light is used as the scanning signal, such an electric parasitic capacitance may not be generated. Accordingly, it is possible to apply an ideal driving waveform to liquid crystal as an electro-optic medium. As a result, it is possible to realize a large-size display apparatus and a high-definition display apparatus.

This invention is characterized in that the display apparatus having the above structure is subjected to a photo-aging process, so that the characteristics of the light switching element 4 are improved and the display performance is enhanced. Hereinafter, the improved characteristics of the light switching element 4 and the method of the photo-aging process are described in detail.

The light switching element is made of a-Si:H film having photoconductivity as described above, and it is known that a-Si:H exhibits a reversible photoinducing phenomenon called the Staebler-Wronski effect.

FIGS. 4 and 5 show the variation over time of the dark conductivity and the photoconductivity of a-Si:H when the photo-aging process is performed. In the photo-aging process, light having a wavelength of 670 nm (a semiconductor laser) and an intensity of 200 mW/cm$^2$ was used. The light switching element was continuously irradiated with the light. The wavelength and intensity of light used for the photo-aging process is not limited to the above-identified values insofar as the light can achieve the photoinducing phenomenon effective for a photoconductor. It is preferred that the light has a wavelength in the vicinity of the bandgap of a semiconductor used for forming the light switching element.

As a result, in the initial stage, great variation over time was observed for both the dark conductivity and the photoconductivity. After the photo-aging for several hours, the dark conductivity and the photoconductivity become stable, and did not greatly vary by additional light irradiation. Specifically, when a-Si:H is used in such a condition that the photoconductivity $\sigma_p$ and the dark conductivity $\sigma_d$ are both varied to 20% or less of the initial values, it is possible to suppress the variation of the dark conductivity and the photoconductivity by additional light irradiation. In practice, the a-Si:H film shown in FIGS. 4 and 5 was used, and both the photoconductivity $\sigma_p$ and the dark conductivity $\sigma_d$ were changed to be 20% or less of the initial values. As a result, the deterioration of display performance such as reduction of contrast and flicker of screen could be eliminated, and a good display performance with little variation over time could be attained.

Conventionally, the display apparatus is used without performing the photo-aging for the light switching element 4 (the a-Si:H film), i.e., in the initial state, so that the conductivity of the light switching element 4 (the a-Si:H film) is varied over time by the light scanning signal from the light emitting element array 1, and hence the display performance deteriorates. That is, the contrast is reduced, and the screen flickers.

However, according to the invention, the display apparatus is used in such a condition that the light switching element 4 is initially stabilized, so that the characteristics of the light switching element 4 do not change. Thus, it is possible to provide a display apparatus exhibiting stable characteristics with less variation over time.

As is understood from FIGS. 4 and 5, the dark conductivity is changed from about $10^{-9}$ (1/Ωcm) in the initial state to about $10^{-10}$ (1/Ωcm) after the photo-aging. The photo-conductivity is changed from about $5 \times 10^{-5}$ (1/Ωcm) in the initial state to about $10^{-5}$ (1/Ωcm) after the aging. In other words, this means that the conductivity change (the $\sigma_p/\sigma_d$ ratio) is improved to be about double that compared with the initial state.

As described above, it is possible to provide a stable display apparatus with less variation over time. Also, it is possible to provide a large-size or high-definition display apparatus because the conductivity change (the $\sigma_p/\sigma_d$ ratio) of the light switching element 4 can be doubled compared with the conventional example. The stable light switching element (a-Si:H) obtained as the result of the photo-aging restores its conductivities in the initial state when it is heated to 160° C. or more. Therefore, the light switching element after the photo-aging can easily be distinguished from the light switching element without the photo-aging.

Next, the method of the photo-aging will be described. In the display apparatus having the above construction, the light emitting element array 10 is used, so that the characteristics of the light switching element 4 (the a-Si:H film) can be stabilized. In general, the light emitting element array 10 emits light for a period equal to (1/the number of scanning lines) per frame in order to progressively driving the display apparatus. In the initial stage immediately after the formation of the display apparatus, the light emitting element array 10 is allowed to continuously emit light for several hours, so as to attain the photo-aging. In this method, the light emitted from the light emitting element array 10 is converged by the microlens array 11 and then incident on the optical waveguides $Y_1, Y_2, \ldots, Y_n$. Accordingly, the intensity per unit area of light transmitted through the optical waveguide is very high, so that a superior photo-aging effect can be achieved for the light switching element 4 (the a-Si:H film) provided on the path of the optical waveguide. Especially when a high-power output semiconductor laser (e.g., TOLD9215 manufactured by TOSHIBA Corp.) is used as the light emitting element array 10, the light intensity is increased, and a superior photo-aging effect can be achieved. In addition, an aging apparatus is not additionally required, so that the aging process can be easily and simply performed.

In this example, a-Si:H is used as the photoconductor material for the light switching element. It is appreciated that the present invention is not limited to this specific material, and any other materials can be used. For example, amorphous silicon germanium hydride (a-SiGe$_x$:H), amorphous germanium hydride (a-Ge:H), and the like can be used for light of near infrared wavelength. In general, the LD and the LED of the near infrared wavelength (in the range of 800 nm to 1000 nm) are developed for optical communication, and are relatively inexpensive. Also, the LD and LED of a high-power output type are also developed. When such a light source is used for emitting light as the scanning signal, it is desired that the light switching element is formed using a-SiGe$_x$:H which has high sensitivity with respect to light having the near infrared wavelength.

As described above, considering the sensitivity of the used light with respect to the wavelength, another photoconductive amorphous material containing a IV-group semiconductor such as Si, Ge, or C as a main component can be used as the photoconductor. In this case, similar to the above-described example, it is possible to provide a stable display apparatus by performing the photo-aging process.

If the light switching element is formed so as to have a photoconductive semiconductor diode structure (e.g., a pin type, a Schottky type, or an MIS type), a back-to-back diode structure in which two of such diodes are connected in series in opposite directions, or a diode ring structure in which two of such diodes are connected in parallel in opposite directions, the change of conductivity (the $\sigma_p/\sigma_d$ ratio) can be effectively improved.

In the case where an element utilizing a junction of such a semiconductor is used as the light switching element, the characteristics of the element can be stabilized by performing the electric-field aging, instead of the above-described photo-aging, and the same effects can be attained. In this case, it is preferable to utilize a signal line (electric wiring) connected to the light switching element, and to apply an electric field for a predetermined time period. For example, electric charge of 50 to 200 mA/cm$^2$ is injected, so as to perform the aging.

In this example, the present invention is applied to a liquid crystal display (LCD) apparatus using liquid crystal as a display medium. It is appreciated that the present invention is not limited to this specific type of display apparatus. In addition to the LCD, the present invention is applicable to an electrochromic display (ECD), an electrophoretic display (EPD), and the like.

As shown in FIG. 1, the present invention is applied to the transmission type display apparatus. In addition, the present invention is applicable to a reflection type liquid crystal display apparatus by using a reflective material such as a metal film for the pixel electrode. Also, the present invention can be applied to a color liquid crystal display apparatus by providing color filters in a panel.

EXAMPLE 2

Next, a spatial light modulating element (SLM) will be described. The SLM can be utilized as a projection type display apparatus and an optical computing element.

The element has a simple structure in which both a photoconductive layer for converting a light signal into an electric signal and an electro-optic medium for converting the electric signal back into a light signal are sandwiched between transparent conductive films. Liquid crystal is known as a material having a great electro-optic effect. The SLM using liquid crystal as an electro-optic medium is specifically called a liquid crystal light valve (LCLV).

Figure 3:
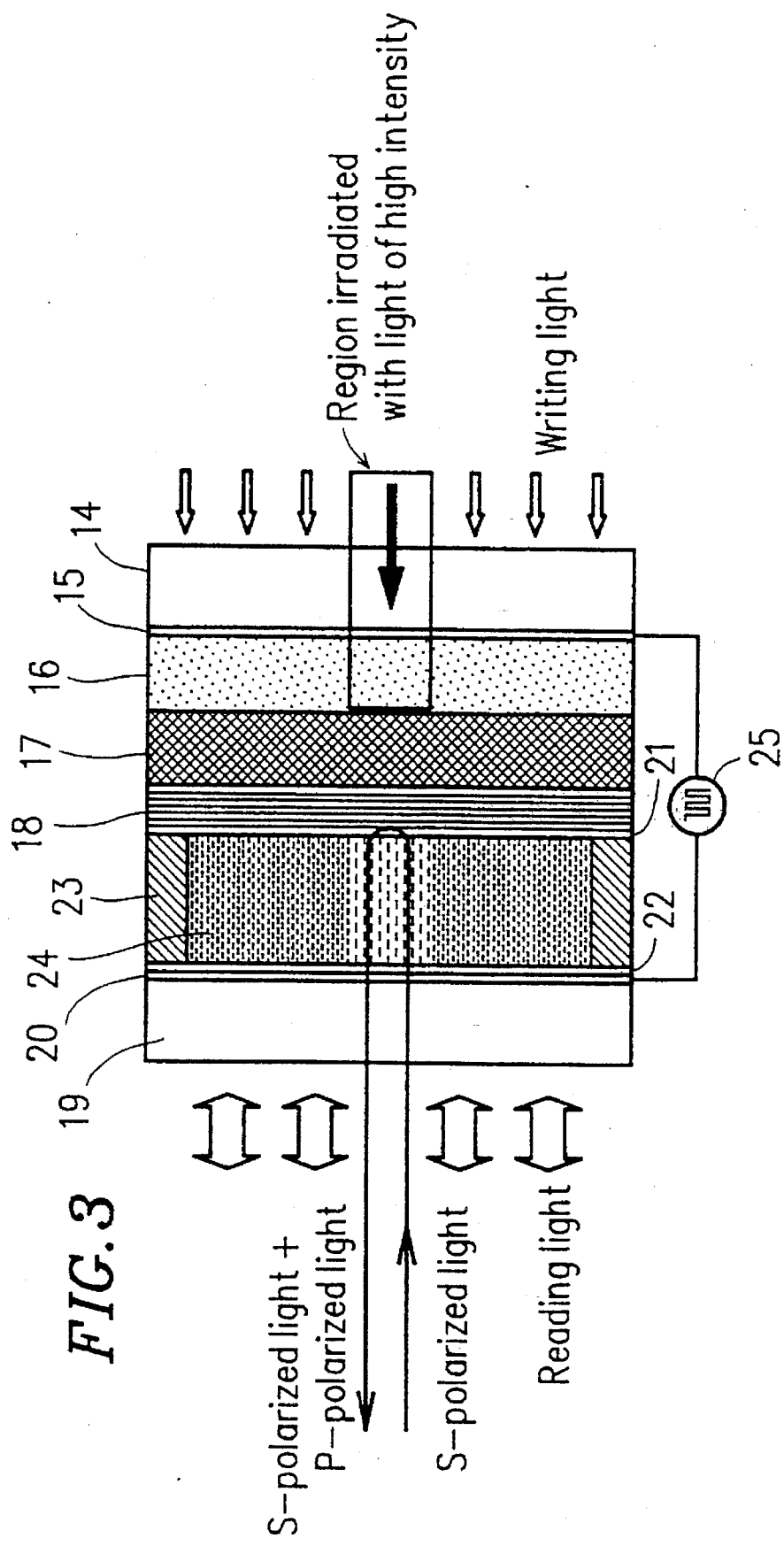
FIG. 3 is a diagram showing the device structure of a spatial light modulating element (LCLV) in Example 2 according to the invention.

FIG. 3 shows the structure of a spatial light modulating element (LCLV) in this example. In the spatial light modulating element, light transmitting substrates 14 and 19 are disposed so as to face each other with a liquid crystal layer 24 interposed therebetween. On one face of the light transmitting substrate 14 which faces the liquid crystal layer 24, a transparent conductive film 15, a photoconductive layer 16, a light blocking film 17, a dielectric mirror 18 are successively formed. On one face of the light transmitting substrate 19 which faces the liquid crystal layer 24, a transparent conductive film 20 is formed.

On the substrate 14, an aligning film 21 is formed on the dielectric mirror 18. On the substrate 19, an aligning film 22 is formed on the transparent conductive film 20. These aligning films 21 and 22 are processed by molecule aligning treatment. Then, the substrates 14 and 19 are attached in such a manner that the aligning films 21 and 22 face each other. A liquid crystal layer 24 is sealed between the substrates 14 and 19 with a sealing member 23.

The dielectric mirror 18 provided between the liquid crystal layer 24 and the photoconductive layer 16 efficiently reflects the light radiation, and the light blocking film 17 provided between the photoconductive layer 16 and the dielectric mirror 18 prevents the light radiation from leaking into the photoconductive layer 16. As a material for the photoconductive layer 16, any material in which the impedance thereof is largely varied due to the light irradiation such as CdS, a-Si:H, and BSO ($Bi_{12}SiO_{20}$) can be suitably used. In this example, a-Si:H was used because of its flexible material design and its desirably controllable characteristics.

For the liquid crystal layer 24, a mixed nematic liquid crystal in which chiral material (S811 by MERCK & Co., Inc.) of about 10 wt % is added to phenylcyclohexan nematic liquid crystal is used. The cell thickness is set to be about 5 μm. The operation mode of the liquid crystal is a phase transition mode. When the nematic liquid crystal is used, instead of the phase transition mode, a twisted nematic mode, an electrically controlled birefringence mode, a dynamic scattering mode, a guest-host mode, or a hybrid electric-field effect mode can also be used. When a smectic liquid crystal is used, an electrically controlled birefringence mode, a guest-host mode, or a light scattering mode can also be used. Alternatively, ferroelectric liquid crystal can be used.

Next, the driving principle in the SLM having the above-described construction will be described below.

The transparent conductive films 15 and 20 are connected to a power source 25. When the writing light incident on the right side of the figure is applied to the photoconductive layer 16, the impedance of the photoconductive layer 16 is varied depending on the intensity of the writing light, and the voltage applied to the liquid crystal layer 24 is accordingly varied.

On the other hand, the reading light incident on the left side of the figure is transmitted by the liquid crystal layer 24, reflected from the dielectric mirror 18, transmitted again by the liquid crystal layer 24, and then output. During this travel, the reading light is modulated as the polarized condition change corresponding to the writing light, in the liquid crystal layer 24. That is, the SLM can serve as a spatial light modulator of the input/output combination type.

In the case where the voltage applied across the transparent conductive films 15 and 20 is a DC voltage, the threshold voltage $V_{th}$ in this element can be approximated as follows:

$$V_{th}=(1+R_p/R_L) V_{Lth} \qquad (4)$$

where $V_{Lth}$ denotes the threshold voltage of liquid crystal, $R_p$ denotes the resistance of the photoconductive layer 16, and $R_L$ denotes the resistance of the liquid crystal layer 24.

The driving condition of the element by the light irradiation is that the $V_{th}$ is smaller than the applied voltage V during the light irradiation and larger than V during the light blocking (dark state) in Expression (4).

Also in the above SLM element having the above construction, the photoconductive layer 16 is formed as an a-Si:H film, so as to exhibit the reversible photoinducing phenomenon called the SW effect. Specifically, the photoconductive layer 16 is directly irradiated with the writing light, so that $R_p$ is varied over time as in the SW effect shown in FIGS. 4 and 5. As a result, in accordance with Expression (4), $V_{th}$ is varied depending on the variation of $R_p$ and the molecule aligning control of the liquid crystal layer 24 is adversely affected.

The present invention is characterized in that the photo-aging process is performed in the SLM element having the above-described construction, as in Example 1. As a result, the photoconductive layer 16 is stabilized and $R_p$ is stabilized. Thus, it is possible to provide an SLM element having no further variation of the characteristics with time.

For the photo-aging, it is convenient to use the same light source as that of the writing light. As the writing light source, in general, a CRT, a liquid crystal display, or an LED or a laser suitably selected on the basis of the photosensitivity of the photoconductive layer 16 can be used. However, the CRT and the liquid crystal display have a problem in that the light emitted therefrom has low intensity, and the LED and the laser have a problem in that it is difficult to irradiate the entire face of the photoconductive layer 16 with light emitted therefrom. Accordingly, they have poor efficiency when actually used as the light source for the photo-aging process.

In this example, the photo-aging is performed by using a halogen lamp, xenon lamp, or a metal halide lamp for reading light when the SLM element is used as the projection type display device. As a result, the entire face of the photoconductive layer 16 can be irradiated with light, and the intensity of light of 100 mW/cm$^2$ or more can be easily obtained. Thus, it is possible to complete the photo-aging over a time period as much as several hours to several tens of hours.

In the case where the voltage applied across the transparent conductive films 15 and 20 is an AC voltage, the threshold voltage Vth in this element can be approximated as follows:

$$V_{th}=(1+Z_p/Z_L) V_{Lth} \qquad (5)$$

where $V_{Lth}$ denotes the threshold voltage of liquid crystal, $Z_p$ denotes the impedance of the photoconductive layer 16, and $Z_L$ denotes the impedance of the liquid crystal layer 24.

The driving condition of the element by the light irradiation is that $V_{th}$ is smaller than the applied voltage V during the light irradiation and larger than V during the light blocking (dark state).

Also in this case, $Z_p$ is stabilized by performing the photo-aging, and it is possible to provide an SLM element having no further variation of the characteristics with time.

In addition, irrespective of AC or DC driving, when the photo-aging is performed for the SLM element, the characteristics of the element can be stabilized, i.e., the reliability can be improved. In addition, the resolution of the element can be improved, i.e., the performance can be improved.

The resolution of the SLM element is largely affected by the expanding degree of the electric field in the in-plane direction (the direction perpendicular to the thickness direction of each layer) in each layer, e.g., in the photoconductive layer 16, the light blocking film 17, the dielectric mirror 18, or the liquid crystal layer 24. The expansion of the electric field in the in-plane direction is controlled by the conductivity which is inherent to each material. Therefore, if the material has a lower conductivity, the electric field is less expanded, and an SLM with higher resolution can be realized.

The variation of conductivities of the a-Si:H film in the photo-aging process is shown in FIGS. 4 and 5. It can be seen from the figures that the dark conductivity can be reduced from the initial value by about one order. As a result, in the case of the SLM element having the previously described construction, it was confirmed that the resolution was improved to be about three to five times after the photo-aging, as compared with that before the aging.

As a material for the photoconductive layer 16, a photoconductive amorphous material including a Group-IV semiconductor such as Si, Ge, or C as a main component can be used, instead of a-Si:H. If such an amorphous material is used, it is possible to provide a stable SLM element with high resolution by performing the photo-aging as in the above-described examples.

The photoconductive layer 16 can be formed in a semiconductor diode structure, e.g., a pin type, a Schottky type, or an MIS type, or in a back-to-back diode structure in which two of these diodes are reversely connected in series. Such a structure is effective in order to provide a margin to the conditions in Expressions (4) and (5).

When the element has the photoconductive layer 16 utilizing a junction of such a semiconductor, the characteristics of the element can be stabilized by performing the electric-field aging, instead of the above-described photo-aging.

For example, when the pin diode structure of a-Si:H is adopted for the photoconductive layer 16, it is more effective that an electric field is applied for several hours so that the electric charge of 50–200 mA/cm$^2$ is injected in a forward direction into the photoconductive layer 16. The combination of the electric-field aging and the photo-aging can be much more effective.

In the above description, the optically addressable display apparatus and the spatial light modulating (SLM) element have been specifically described as examples of the invention. It is appreciated that the present invention is not limited to such specific types of apparatus. The present invention is applicable to any other light information device utilizing the photoconductive effect and the photovoltaic effect. For example, the present invention can be applied to a light amount adjusting apparatus described in, for example, "Optical Stabilizer and Directional Coupler Switch Using Polymer Thin Film Waveguides with Liquid Crystal Clad Jpn. J. Appl. Phys. 29, 1724 (1990), Japanese Patent Application No. 4-17937, or the like, or an input/output combination type display apparatus having a hand-writing input function described in Japanese Patent Application No. 4-11157 or the like.

As described above in detail, according to the invention, the characteristics of the element can be stabilized by an external stimulus such as light irradiation and/or application of an electric field. In other words, by using a semiconductor material into which the SW effect is positively introduced, the variation of the characteristics over time is suppressed and a stable performance can be obtained in various light information devices such as an optically addressable display apparatus, an SLM, or a light sensor.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A light information device produced in accordance with the following process steps:

producing a semiconductor element having a photoconductive effect or a photovoltaic effect and having an initial photoconductivity and an initial dark conductivity;

combining one or more additional elements with the semiconductor element which, in cooperation with the semiconductor element, allow the light information device to be used for a predefined function; and substantially upon completion of the combining step performing a deliberate aging process including the step of:

applying a controlled external stimulus to the semiconductor element substantially for the purpose of varying the photoconductivity and the dark conductivity of the semiconductor element so as to have reduced values which are equal to or lower than 20% of the initial photoconductivity and the initial dark conductivity, whereby variation over time of the reduced photoconductivity and the reduced dark conductivity during the use of the light information device for the predefined function is reduced.

2. A light information device according to claim 1, wherein the semiconductor is an amorphous semiconductor including a Group-IV semiconductor as a main component.

3. A light information device according to claim 1, wherein a ratio of the photoconductivity to the dark conductivity of the semiconductor after the aging process is twice or more as high as an initial ratio of the photoconductivity to the dark conductivity before the aging process.

4. A method for producing a light information device, comprising the steps of:

selecting a semiconductor having a photoconductive effect or a photovoltaic effect and having an initial photoconductivity and an initial dark photoconductivity;

applying a controlled external stimulus to said semiconductor;

inducing aging of said semiconductor in accordance with said step of applying said controlled external stimulus; and selectively varying said initial conductivity and said initial dark conductivity, in accordance with said step of inducing aging, to produce a stabilized semiconductor having a reduced photoconductivity and a reduced dark conductivity which are 20% or less of said initial photoconductivity and said initial dark conductivity, wherein variation over time of said reduced photoconductivity and said reduced dark conductivity of said stabilized semiconductor is reduced.

5. A method for producing a light information device according to claim 4, wherein the aging step comprises the steps of:

irradiating the semiconductor with light; and varying the photoconductivity and the dark conductivity of the semiconductor by continuously performing the light irradiation for a predetermined time period, and reducing the photoconductivity and the dark conductivity to be 20% or less of the respective initial values thereof before the light irradiation.

6. A method for producing a light information device according to claim 5, wherein the aging step further comprises the step of:

applying an electric field to the semiconductor for a predetermined time period.

7. A method for producing a light information device according to claim 4, wherein, in the step of light irradiation, the semiconductor is irradiated with light of an intensity of 100 mW/cm$^2$ or more.

8. A method for producing a light information device according to claim 7, wherein, in the step of light irradiation, the semiconductor is irradiated with light in a wavelength band including a wavelength corresponding to a bandgap of the semiconductor.

9. A method for producing a light information device according to claim 4, wherein the aging step comprises the steps of:

applying an electric field to the semiconductor; and varying the photoconductivity and the dark conductivity of the semiconductor by continuously applying the electric field for a predetermined time period, and reducing the photoconductivity and the dark conductivity to be 20% or less of the respective initial values thereof before the application of the electric field.

10. A method for producing a light information device according to claim 9, wherein the aging step further comprises the step of:

irradiating the semiconductor with light for a predetermined time period.

11. A method for producing a light information device according to claim 9, wherein, in the step of applying the electric field, electric charge of 50–200 mA/cm$^2$ is injected into the semiconductor.

12. A light information apparatus comprising optical addressing means for selectively turning ON at least one of a plurality of switching devices in accordance with a light signal, wherein each of the plurality of switching devices includes an input terminal for receiving an electric signal, an output terminal for outputting the received electric signal, and a semiconductor for providing a conductive path from the input terminal to the output terminal in accordance with the received light signal due to a photoconductive effect, and a photoconductivity and a dark conductivity of the semiconductor of each of the switching devices are varied by an aging process using an external stimulus, and the photoconductivity and the dark conductivity after the aging process are reduced to be 20% or less of respective initial values thereof before the aging process wherein the light information device is produced according to the following steps:

producing a semiconductor element having a photoconductive effect or a photovoltaic effect and having an initial photoconductivity and an initial dark conductivity;

combining one or more additional elements with the semiconductor element which, in cooperation with the semiconductor element, allow the light information device to be used for a predefined function; and substantially upon completion of the combining step performing a deliberate aging process including the step of:

applying a controlled external stimulus to the semiconductor element substantially for the purpose of varying the photoconductivity and the dark conductivity of the semiconductor element so as to have reduced values which are equal to or lower than 20% of the initial photoconductivity and the initial dark conductivity, whereby variation over time of the reduced photoconductivity and the reduced dark conductivity during the use of the light information device for the predefined function is reduced.

13. A light information apparatus according to claim 12 wherein the optical addressing means includes means for supplying the electric signal to each of the plurality of switching devices, and means for supplying the light signal to each of the plurality of switching devices.

14. A light information apparatus according to claim 13, wherein the means for supplying the light signal includes light emitting means for generating the light signal, and means for selectively transmitting the light signal from the light emitting means to the plurality of switching device.

15. A light information apparatus according to claim 13, further comprising:

pixel electrodes each provided for a corresponding one of the plurality of switching devices, and each connected to the output terminal of the corresponding one of the switching devices, each of the pixel electrodes receiving the electric signal via the corresponding one of the switching devices; and a display medium driven by the pixel electrodes.

16. A light information apparatus according to claim 14, wherein the light emitting means is a semiconductor laser.

17. A method for producing a light information apparatus comprising optical addressing means for selectively turning ON at least one of a plurality of switching devices in accordance with a light signal, each of the plurality of switching devices including an input terminal for receiving an electric signal, an output terminal for outputting the received electric signal, and a semiconductor for providing a conductive path from the input terminal to the output terminal in accordance with the received light signal due to a photoconductive effect, wherein the method includes an aging step of varying a photoconductivity and a dark conductivity of the semiconductor by applying an external stimulus, and reducing the photoconductivity and the dark conductivity after the aging process to be 20% or less of respective initial values thereof before applying the external stimulus and wherein the light information device is produced in accordance with the following process steps:

producing a semiconductor element having a photoconductive effect or a photovoltaic effect and having an initial photoconductivity and an initial dark conductivity;

combining one or more additional elements with the semiconductor element which, in cooperation with the semiconductor element, allow the light information device to be used for a predefined function; and substantially upon completion of the combining step performing a deliberate aging process including the step of:

applying a controlled external stimulus to the semiconductor element substantially for the purpose of varying the photoconductivity and the dark conductivity of the semiconductor element so as to have reduced values which are equal to or lower than 20% of the initial photoconductivity and the initial dark conductivity, whereby variation over time of the reduced photoconductivity and the reduced dark conductivity during the use of the light information device for the predefined function is reduced.

18. A method for producing a light information apparatus according to claim 17, wherein the optical addressing means includes light emitting means for generating the light signal, and the aging step includes the steps of:

irradiating the semiconductor with light emitted from the light emitting means; and varying the photoconductivity and the dark conductivity of the semiconductor by continuously performing the light irradiation for a predetermined time period, and reducing the photoconductivity and the dark conductivity after the light irradiation to be 20% or less of respective initial values thereof before the light irradiation.

19. A method for producing a light information apparatus according to claim 18, wherein the optical addressing means includes light guiding means for transmitting the light signal from the light emitting means to each of the plurality of switching devices, and the light irradiation is performed via the light guiding means.

20. A method for producing a light information apparatus according to claim 18, wherein the light emitting means is a semiconductor laser, and laser light is used for the light irradiation.

21. A method for producing a light information apparatus according to claim 18, wherein, in the step of light irradiation, the semiconductor is irradiated with light of an intensity of 100 mW/cm$^2$ or more.

22. A method for producing a light information apparatus according to claim 18, wherein, in the step of light irradiation, the semiconductor is irradiated with light in a wavelength band including a wavelength corresponding to a bandgap of the semiconductor.

23. A method for producing a light information apparatus according to claim 18, wherein the optical addressing means includes means for supplying the electric signal to each of the plurality of switching devices, and
the aging step further includes a step of applying an electric field to the semiconductor for a predetermined time period by applying the electric signal to the respective switching devices by the supplying means.

24. A method for producing a light information apparatus according to claim 17, wherein the optical addressing means includes means for supplying the electric signal to each of the plurality of switching devices, and
the aging step includes the steps of:
applying an electric field to the semiconductor by supplying the electric signal to the respective switching devices by the supplying means; and
varying the photoconductivity and the dark conductivity of the semiconductor by applying the electric field for a predetermined time period, and reducing the photoconductivity and the dark conductivity to be 20% or less of the respective initial values thereof before the application of the electric field.

25. A method for producing a light information apparatus according to claim 24, wherein, in the step of applying the electric field, electric charge of 50–200 mA/cm$^2$ is injected into the semiconductor.

26. A method for producing a light information apparatus according to claim 24, wherein the light address means includes light emitting means for generating the light signal, and the aging step includes a step of irradiating the semiconductor with light emitted from the light emitting means for a predetermined time period.

27. A light information device comprising: a first substrate and a second substrate; a semiconductor layer disposed on one face of the first substrate facing the second substrate; and an electro-optic medium provided on one face of the second substrate facing the first substrate, the light information device writing spatial light information input from the outside to the semiconductor layer through the first substrate into the electro-optic medium using a photoconductive effect of the semiconductor layer, and the light information device reading the spatial light information written in the electro-optic medium by modulating light input through the second substrate by the electro-optic medium,
wherein the semiconductor layer has a photoconductivity and a dark conductivity varied by an aging process using an external stimulus, and values of the varied photoconductivity and the dark conductivity are 20% or less of respective initial values thereof before the aging process and wherein the light information device is produced by the following process steps:
producing a semiconductor element having a photoconductive effect or a photovoltaic effect and having an initial photoconductivity and an initial dark conductivity;
combining one or more additional elements with the semiconductor element which, in cooperation with the semiconductor element, allow the light information device to be used for a predefined function; and
substantially upon completion of the combining step performing a deliberate aging process including the step of:
applying a controlled external stimulus to the semiconductor element substantially for the purpose of varying the photoconductivity and the dark conductivity of the semiconductor element so as to have reduced values which are equal to or lower than 20% of the initial photoconductivity and the initial dark conductivity,
whereby variation over time of the reduced photoconductivity and the reduced dark conductivity during the use of the light information device for the predefined function is reduced.

28. A method for producing a light information device comprising: a first substrate and a second substrate; a semiconductor layer disposed on one face of the first substrate facing the second substrate; and an electro-optic medium provided on one face of the second substrate facing the first substrate, the light information device writing spatial light information input from the outside to the semiconductor layer through the first substrate into the electro-optic medium using a photo conductive effect of the semiconductor layer, and the light information device reading the spatial light information written in the electro-optic medium by modulating light input through the second substrate by the electro-optic medium, the method comprising
an aging process including the steps of
applying a controlled external stimulus to said semiconductor;
inducing aging of said semiconductor in accordance with said step of applying said controlled external stimulus; and
selectively varying said initial conductivity and said initial dark conductivity, in accordance with said step of inducing aging, to produce a stabilized semiconductor having a reduced photoconductivity and a reduced dark conductivity which are 20% or less of said initial photoconductivity and said initial dark conductivity, wherein variation over time of said reduced photoconductivity and said reduced dark conductivity of said stabilized semiconductor is reduced.

29. A method for producing a light information device according to claim 28, wherein the aging process includes the steps of:
irradiating the semiconductor layer with light; and
varying the photoconductivity and the dark conductivity of the semiconductor layer by continuously performing the light irradiation for a predetermined time period, and reducing the photoconductivity and the dark conductivity to be 20% or less of respective initial values thereof before the light irradiation.

30. A method for producing a light information device according to claim 29, wherein, in the step of light irradiation, the semiconductor layer is irradiated with light with an intensity of 100 mW/cm$^2$.

31. A method for producing a light information device according to claim 29, wherein, in the step of light irradiation, the semiconductor layer is irradiated with light in a wavelength band including a wavelength corresponding to a bandgap of the semiconductor layer.

32. A method for producing a light information device according to claim 29, wherein the light irradiation is performed by using a lamp selected from a group of a halogen lamp, a metal halide lamp, and a xenon lamp.

33. A method for producing a light information device according to claim 29, wherein the aging process further includes the step of applying an electric field to the semiconductor layer for a predetermined time period.

34. A method for producing a light information device according to claim 28, wherein the aging process includes the steps of:

applying an electric field to the semiconductor layer; and varying the photoconductivity and the dark conductivity of the semiconductor layer by continuously performing the application of the electric field for a predetermined time period, and reducing the photoconductivity and the dark conductivity to be 20% or less of respective initial values thereof before the application of the electric field.

35. A method for producing a light information device according to claim 34, wherein, in the step of applying the electric field, electric charge of 50–200 mA/cm$^2$ is injected into the semiconductor layer.

36. A method for producing a light information device according to claim 34, wherein the aging process further includes the step of irradiating the semiconductor layer with light for a predetermined time period.

37. A light information device produced in accordance with the following process steps:

producing a semiconductor element having a photoconductive effect or a photovoltaic effect and having an initial photoconductivity and an initial dark conductivity;

combining one or more additional elements with the semiconductor element which, in cooperation with the semiconductor element, allow the light information device to be used for a predefined function; and substantially upon completion of the combining step performing a deliberate aging process including the step of:

applying for a predetermined time period at least one of light irradiation and an electric field to the semiconductor element substantially for the purpose of varying the photoconductivity and the dark conductivity of the semiconductor element so as to have reduced values which are equal to or lower than 20% of the initial photoconductivity and the initial dark conductivity, whereby variation over time of the reduced photoconductivity and the reduced dark conductivity during the use of the light information device for the predefined function is reduced.

* * * * *